United States Patent [19]

Razavi

[11] Patent Number: 5,289,055
[45] Date of Patent: Feb. 22, 1994

[54] DIGITAL ECL BIPOLAR LOGIC GATES SUITABLE FOR LOW-VOLTAGE OPERATION

[75] Inventor: Behzad Razavi, Middletown, N.J.

[73] Assignee: AT&T Bell Laboratories, Murray Hill, N.J.

[21] Appl. No.: 977,342

[22] Filed: Nov. 17, 1992

[51] Int. Cl.$^5$ .................... H03K 19/086; H03K 19/21
[52] U.S. Cl. ..................................... 307/455; 307/289; 307/471
[58] Field of Search ............ 307/455, 289, 471, 272.2, 307/480

[56] References Cited

U.S. PATENT DOCUMENTS

| | | | |
|---|---|---|---|
| 3,404,285 | 10/1968 | Hazlett | 307/455 |
| 4,311,925 | 1/1982 | Chang et al. | 307/455 |
| 4,675,553 | 6/1987 | Price et al. | 307/289 |
| 4,700,087 | 10/1987 | Stroberger | 307/475 |
| 4,962,341 | 10/1990 | Schoeff | 307/200.1 |
| 4,970,417 | 11/1990 | Kubota | 307/455 |
| 4,977,335 | 12/1990 | Ogawa | 307/455 |
| 5,001,370 | 3/1991 | Phan et al. | 307/475 |
| 5,043,602 | 8/1991 | Flannagan | 307/455 |
| 5,079,452 | 1/1992 | Lain et al. | 307/480 |
| 5,220,212 | 6/1993 | Sinh | 307/455 |

OTHER PUBLICATIONS

K. G. Moerschel et al., "Best: A BiCMOS-Compatible Super-Self-Aligned ECL Technology", IEEE 1990 Custom Integrated Circuits Conference (1990) 18.3.1–18.3.4.

Primary Examiner—Edward P. Westin
Assistant Examiner—Richard Roseen
Attorney, Agent, or Firm—Martin I. Finston

[57] ABSTRACT

Several digital bipolar logic circuits are described, for applications as digital logic gates and for buffering and level-shifting. These circuits are adapted for high-speed operation, and they have reduced supply-voltage requirements. In each of these circuits, a control device such as a transistor turns an input circuit on or off by means of an emitter-to-emitter connection. However, unlike most conventional ECL circuits, these circuits avoid stacked transistor configurations.

8 Claims, 12 Drawing Sheets

DIGITAL ECL BIPOLAR LOGIC GATES SUITABLE FOR LOW-VOLTAGE OPERATION

FIELD OF THE INVENTION

This invention relates to digital bipolar logic circuits adapted for high-speed operation, and more specifically, to logic circuits in which a control device such as a transistor turns an input circuit on or off by means of an emitter-to-emitter connection.

ART BACKGROUND

Integrated circuit designers have long recognized that many portable electronic systems can be improved by reducing their power dissipation or their battery requirements. Designers have also recognized that the fastest silicon transistors generally have relatively low breakdown voltages. For all of these reasons, circuit designers have sought to scale the supply voltages of digital circuits from the conventional level of about 5 volts, down to 3.3 volts, and even to 1.5 volts. However, it is difficult to preserve high-speed operation at low power-supply voltages, particularly at voltages as low as 1.5 volts.

For example, emitter-coupled logic (ECL) technology is widely used for high-speed logic gates. Depicted in FIG. 2 is a typical ECL circuit for use as a multiplexer. The output voltage, or half of the output voltage, appears at node X as a voltage drop across resistor R2.1. The current through this resistor follows alternate paths to the supply voltage $V_{EE}$ via transistors Q2.1 and Q2.7, or transistors Q2.3 and Q2.8. Each path includes two transistors in a stacked pair configuration. (Two transistors are said to be "stacked" if the emitter terminal of one is connected to the collector terminal of the other.) Because each base-emitter junction of these transistors generally requires a voltage drop of about 0.8 volts, the power supply voltage must be substantially greater than 1.5 volts if deep saturation of these transistors is to be avoided.

By contrast, a power supply voltage as low as 1.5 volts can be used with circuits in which no path between the power supply voltage and ground includes a stacked pair of transistors. A well-known circuit of that kind, for calculating the logical OR function, is illustrated in FIG. 1. In the circuit of FIG. 1, the flow of current through transistor Q1.3 is controlled by transistors Q1.1 and Q1.2, which are coupled to it by emitter-to-emitter connections.

Such a circuit, and circuits like it, can offer high-speed operation even at relatively low power-supply voltages, such as 1.5 volts. However, circuit designers have hitherto failed to provide more than one or a few such circuits. Until now, a general selection of circuits of this kind, able to perform a wide variety of logical operations, has been lacking.

SUMMARY OF THE INVENTION

We have provided, for the first time, a variety of digital bipolar circuits that can operate at speeds exceeding one GHz with power supply voltages as low as 1.5 V or even less. The bias currents of differential pairs and emitter followers used in these circuits are generated using resistors tied from their respective emitters to the voltage level $V_{EE}$. The voltage drop across each of these resistors is typically about 500 mV. (In the description that follows, $V_{EE}$ is assumed to be provided by a $-1.5$ volt power supply. However, the invention is not limited to negatively biased circuits, but is also readily implemented in positively biased circuits operating, e.g., between ground potential and $V_{CC} = +1.5$ V.) In each of these circuits, a transistor turns an input circuit on or off by means of an emitter-to-emitter connection, and no path between the power-supply voltage and ground includes a stacked pair of transistors.

DETAILED DESCRIPTION OF SOME PREFERRED EMBODIMENTS

In preferred embodiments, the circuits described herein are fabricated according to a BICMOS-compatible, super-self-aligned fabrication technology for silicon bipolar integrated circuits. Such a technology is described in K. G. Moerschel et al., "BEST: A BICMOS-Compatible Super-Self-Aligned ECL Technology", *IEEE* 1990 *Custom Integrated Circuits Conference* (1990) 18.3.1–18.3.4, incorporated herein by reference. The technology described therein has a 1.5-μm design rule, and circuits made in accordance therewith can have ECL propagation delays as small as 87 ps at a power level of 2 mW/gate.

Figure 3:
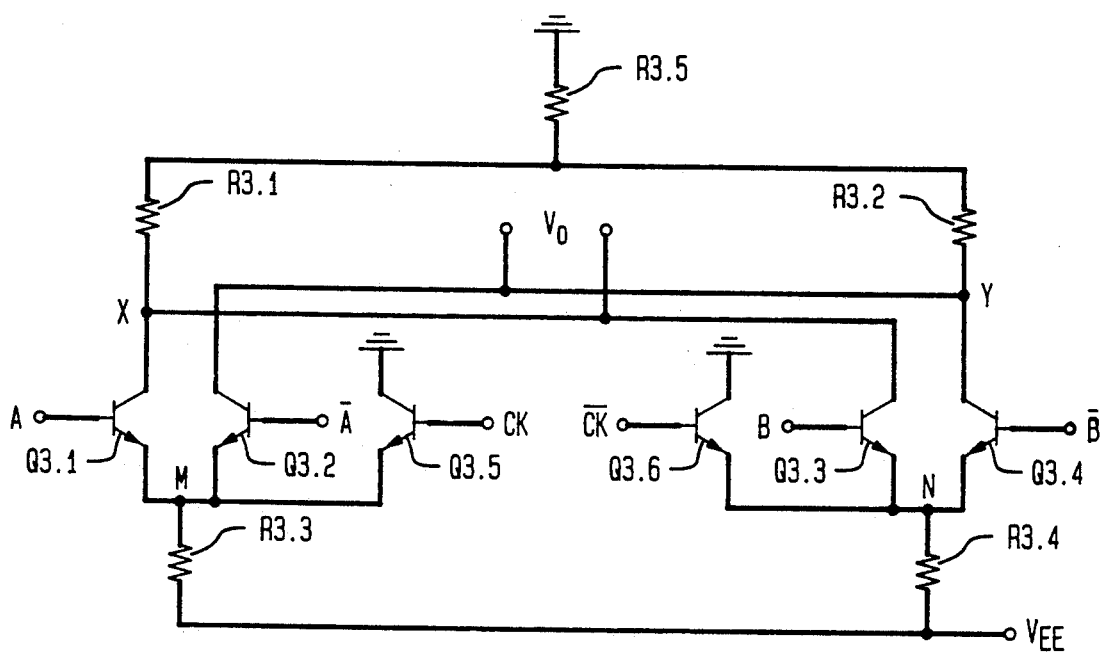
FIG. 3 is a schematic representation of al typical ECL circuit according to the invention, in one embodiment.

As noted, the bias currents of differential pairs and emitter followers used in the circuits described herein are generated using certain resistors, such as resistor R3.3 and R3.4 of FIG. 3. It should be further noted that these resistors can be replaced by NMOS devices, because properly sized MOS transistors can remain in saturation even with a drain-source voltage as low as 500 mV. The use of saturated NMOS devices is advantageous because it provides higher immunity to variations in the power-supply voltage. Accordingly, when the term "resistor" or "resistive means" is used herein to refer to a device connected between an emitter terminal and the power-supply voltage, the term is meant to include appropriate NMOS devices.

Figure 1:
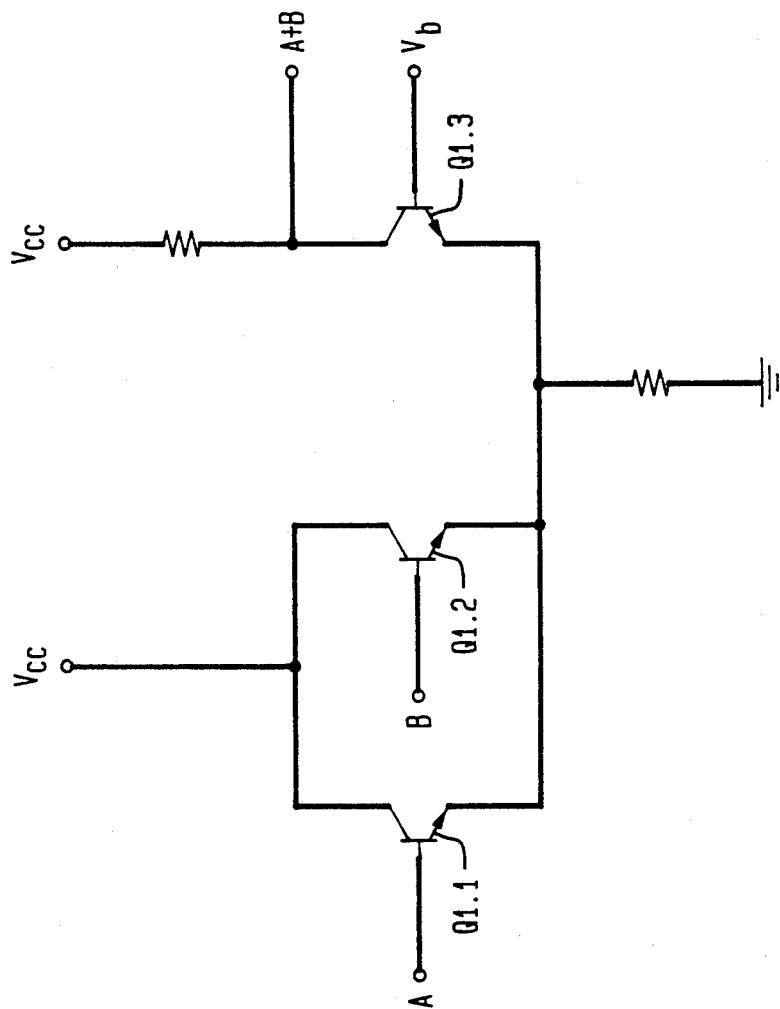
FIG. 1 is a well-known circuit of the prior art, used for calculating the logical OR function.
Figure 2:
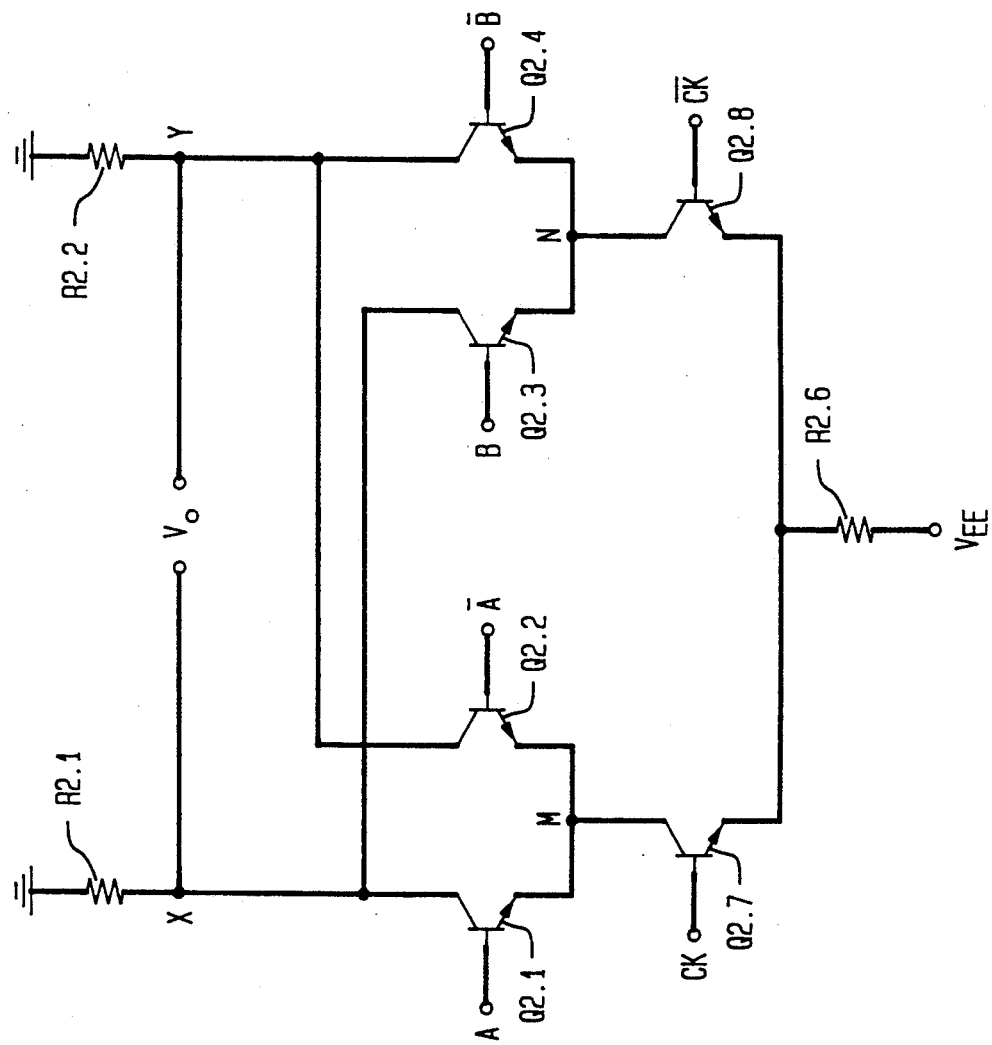
FIG. 2 is a schematic representation of a typical ECL circuit of the prior art, used as a multiplexer.

As noted, FIG. 2 depicts a conventional ECL multiplexer circuit. In this circuit, transistors Q2.1 and Q2.2 form a differential pair having A and $\overline{A}$ inputs connected to the respective transistor bases, and transistors Q2.3 and Q2.4 form a differential pair having B and $\overline{B}$ inputs connected to respective bases. The emitters of the first differential pair are electrically connected at node M, and the emitters of the second differential pair are connected at node N. Nodes M and N are electrically connected to the power-supply voltage $V_{EE}$ through transistor Q2.7 and resistor R2.6, and through transistor Q2.8 and resistor R2.6, respectively. Transistors Q2.1 and Q2.2 are alternately enabled and disabled by a clock signal CK applied to the base of transistor Q2.7, which results in alternations of the current drawn from node M. Similarly, transistors Q2.3 and Q2.4 are alternately enabled and disabled by the clock signal complement $\overline{CK}$ applied to the base of transistor Q2.8, which results in alternations of the current drawn from node N. The output voltage is taken between nodes X and Y. Node X is electrically connected on one side to the collector of transistor Q2.1 and on the other side to ground through resistor R2.1. Node Y is electrically connected on one side to the collector of transistor Q2.4, and on the other side to ground through resistor R2.2.

Depicted in FIG. 3 is a multiplexer circuit according to the invention, in one embodiment. This circuit is similar to the circuit of FIG. 2 in several respects. That is, transistors Q3.1 and Q3.2 form a differential pair having A and $\overline{A}$ inputs connected to respective bases, and transistors Q3.3 and Q3.4 form a differential pair having B and $\overline{B}$ inputs connected to respective bases. The emitters of the first differential pair are electrically connected at node M, and the emitters of the second differential pair are connected at node N. Nodes M and N are electrically connected to the power-supply voltage $V_{EE}$ through resistors R3.3 and R3.4, respectively. Transistors Q3.1 and Q3.2 are alternately enabled and disabled by clock signal CK applied to the base of transistor Q3.5, which results in alternations of the voltage at node M. Similarly, transistors Q3.3 and Q3.4 are alternately enabled and disabled by signal $\overline{CK}$ applied to the base of transistor Q3.6, which results in alternations of the voltage at node N. The output voltage is taken between nodes X and Y. Node X is electrically connected on one side to the collector of transistor Q3.1 and on the other side to ground through resistors R3.1 and R3.5. Node Y is electrically connected on one side to the collector of transistor Q3.4, and on the other side to ground through resistors R3.2 and R 3.5.

However, the placing of the clock transistors Q3.5 and Q3.6 distinguishes the multiplexer of FIG. 3 from the multiplexer of FIG. 2. That is, these transistors are not in series with their respective differential pairs. Instead, the collector of each clock transistor is electrically connected to ground, and the emitter is electrically connected to node M or node N, respectively, such that both emitters in each differential pair are connected to the emitter of the corresponding clock transistor. As a consequence of this arrangement of transistors, no path for electric current between $V_{EE}$ and ground via any one of Q3.1, Q3.2, Q3.3, and Q3.4 includes includes a stacked pair of transistors.

In operation, the circuit of FIG. 3, as well as the other inventive circuits described below, uses 400-mV single-ended swings to define changes in logical state. The circuits use two types of signal, distinguished by their common-mode levels. Signals referred to herein as "type I" signals have a common-mode level of −200 mV, and signals referred to as "type II" signals have a common-mode level of −400 mV. Thus in the circuit of FIG. 3, resistor R3.5 establishes a common-mode level of −400 mV at the output. In this circuit, the clock signals CK and $\overline{CK}$ are type I, and all other signals (i.e., the A and B signals and their complements, and the output signal) are type II.

The operation of the circuit of FIG. 3 is now described. When CK goes high, transistor Q3.5 pulls node M high, turning off transistors Q3.1 and Q3.2. Simultaneously, $\overline{CK}$ goes low, permitting resistor R3.4 to draw current from transistors Q3.3 and Q3.4. Thus, Q3.1 and Q3.2 are disabled, Q3.3 and Q3.4 are enabled, and the logical output is equal to the logical B input. The symmetry of the circuit design shows that by an analogous argument, when CK goes low, the logical output changes to the logical A input. It should be noted that transistors Q3.1, Q3.2, Q3.3, and Q3.4 experience a base-collector forward bias of 400 mV, and therefore they enter soft saturation during operation of the circuit. However, these transistors do not enter deep saturation, and therefore the penalty incurred in operating speed, if any, is relatively small.

Figure 4:
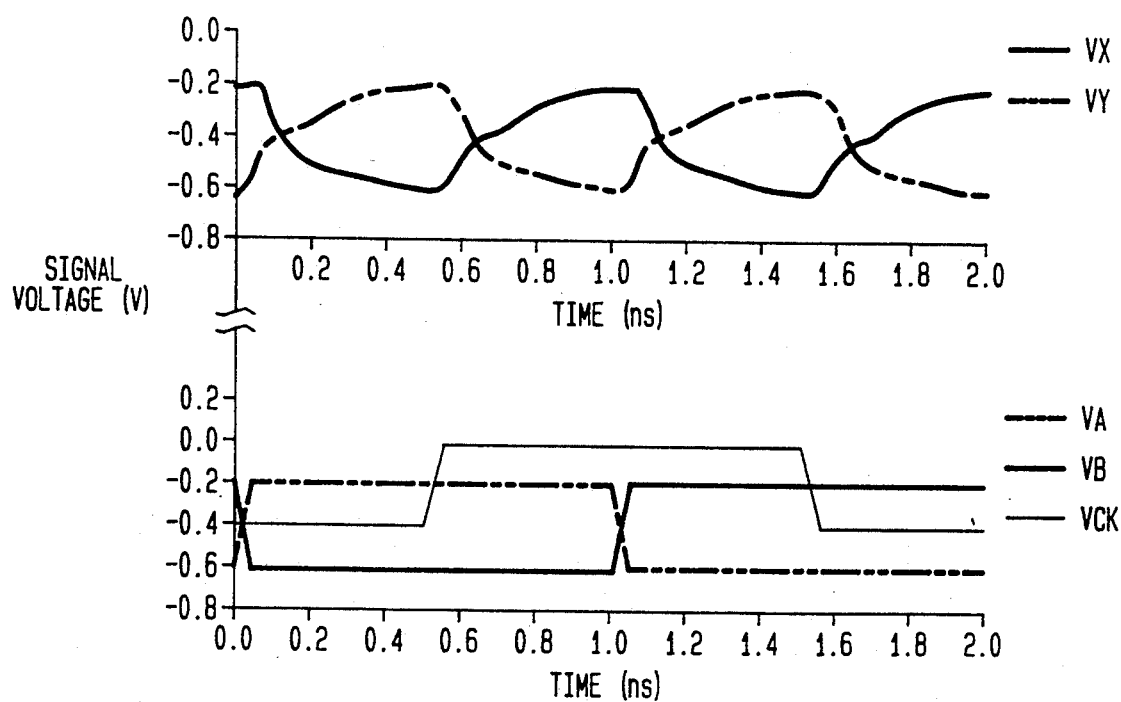
FIG. 4 is a graph representing computer simulations of input and output waveforms for operation of the circuit of FIG. 3.

FIG. 4 is a graph representing computer simulations of input and output waveforms for operation of the circuit of FIG. 3 with a fanout of 1 and power dissipation of 1.2 mW. In the simulation, the A, B, and CK input signals oscillate at 500 MHz, A leads B by 180°, and CK leads B by 90°.

Figure 5:
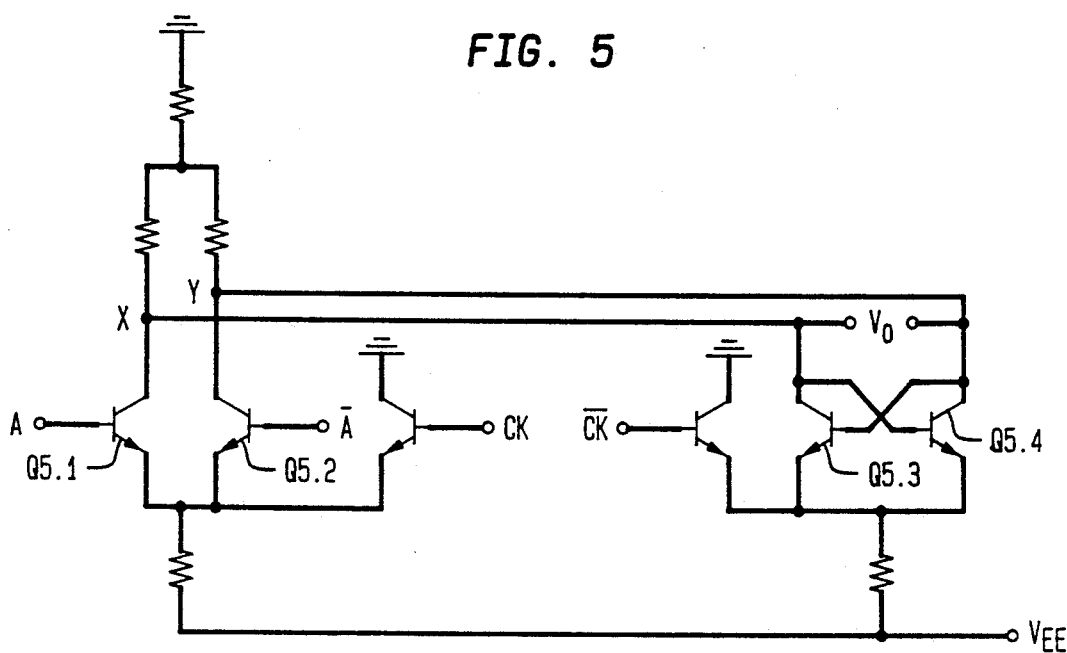
FIG. 5 is a schematic representation of a latch circuit according to the invention in one embodiment. This circuit is related to the multiplexer circuit of FIG. 3.

Another embodiment of the invention is a latch circuit, such as the circuit of FIG. 5. This circuit is readily derived from the multiplexer circuit of FIG. 3 by eliminating the B and $\overline{B}$ inputs, and instead cross-connecting transistors Q3.3 and Q3.4 (i.e., transistors Q5.3 and Q5.4 of FIG. 5) to form a latch pair. This cross-connection is carried out by electrically connecting the collector of each transistor to the base of the other transistor.

The operation of this latch circuit is now described. When CK is low, the input pair (transistors Q5.1 and Q5.2) is enabled, nodes X and Y track the input signal, and latch transistors Q5.3 and Q5.4 are off. When CK goes high, the input pair is disabled, the latch pair is on, and the instantaneous state at X and Y is stored in the loop around the latch pair.

Figure 6:
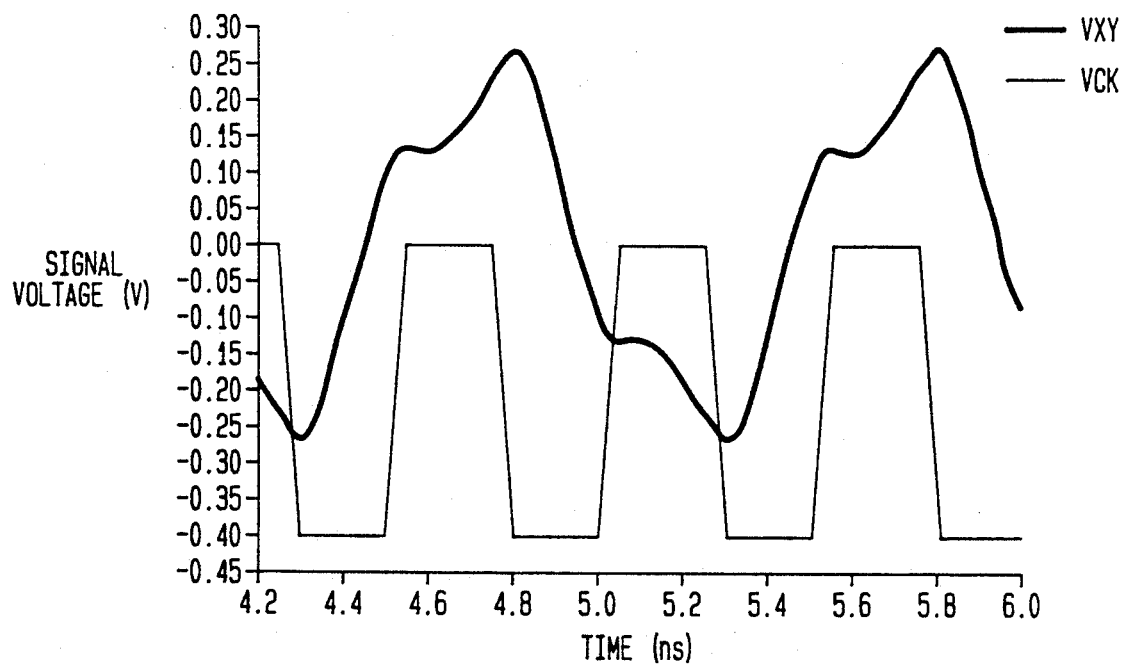
FIG. 6 is a graph representing computer simulations of the clock signal and the differential output of two circuits, similar to the circuit of FIG. 5, configured together in a master-slave configuration to form a frequency divider.

To evaluate its performance, a pair of these latch circuits can be incorporated in a well-known master-slave configuration with feedback which functions to divide the clock frequency by two. FIG. 6 is a graph representing computer simulations of the clock signal and the differential output of such a frequency divider operating at 2 GHz with a power dissipation of 2.8 mW (1.4 mW per latch).

Figure 7:
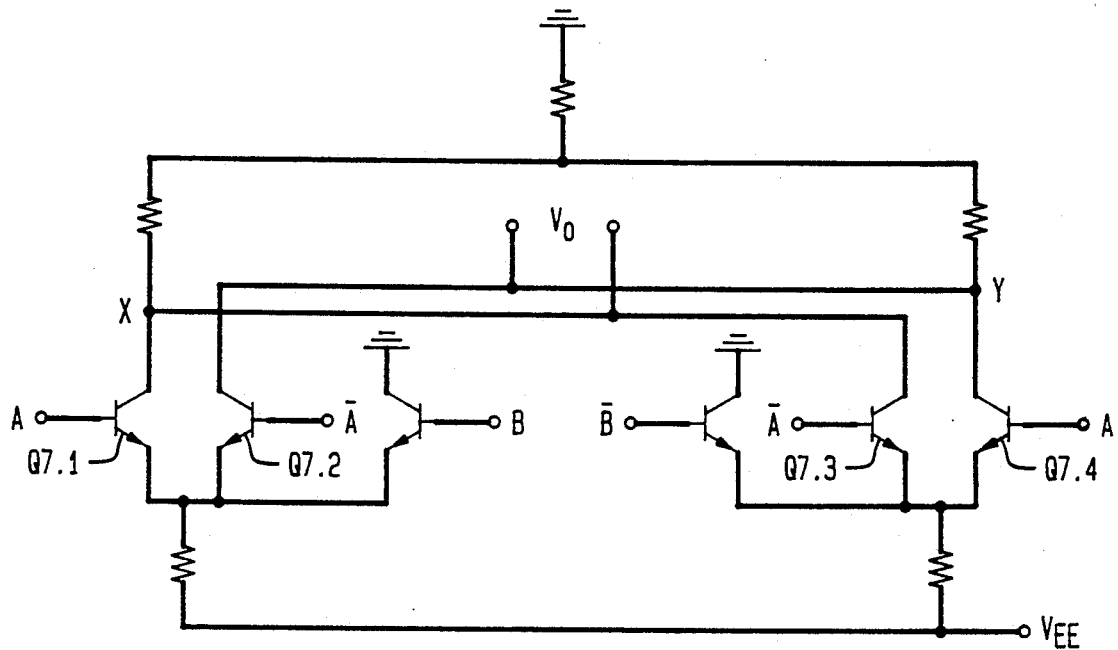
FIG. 7 is a schematic representation of an exclusive OR (XOR) circuit according to the invention in one embodiment. This circuit is relaxed to the multiplexer circuit of FIG. 3.

Another embodiment of the invention is an exclusive OR (XOR) circuit, such as the circuit of FIG. 7. This circuit is readily derived from the multiplexer circuit of FIG. 3 by substituting B and $\bar{B}$ for CK and $\overline{CK}$, respectively, substituting A for B at the input to transistor Q3.3 (transistor Q7.3 of FIG. 7), and substituting A for $\bar{B}$ at the input to transistor Q3.4 (transistor Q7.4 of FIG. 7). As a result of these substitutions, the logical value of the output will equal the logical A input if B is low, and will equal the logical $\bar{A}$ input if B is high. Thus, the output will be 0 if A and B are both low or both high, and will be 1 if B is low and A is high, or if B is high and A is low. This describes the XOR function A⊕B.

Figure 9:
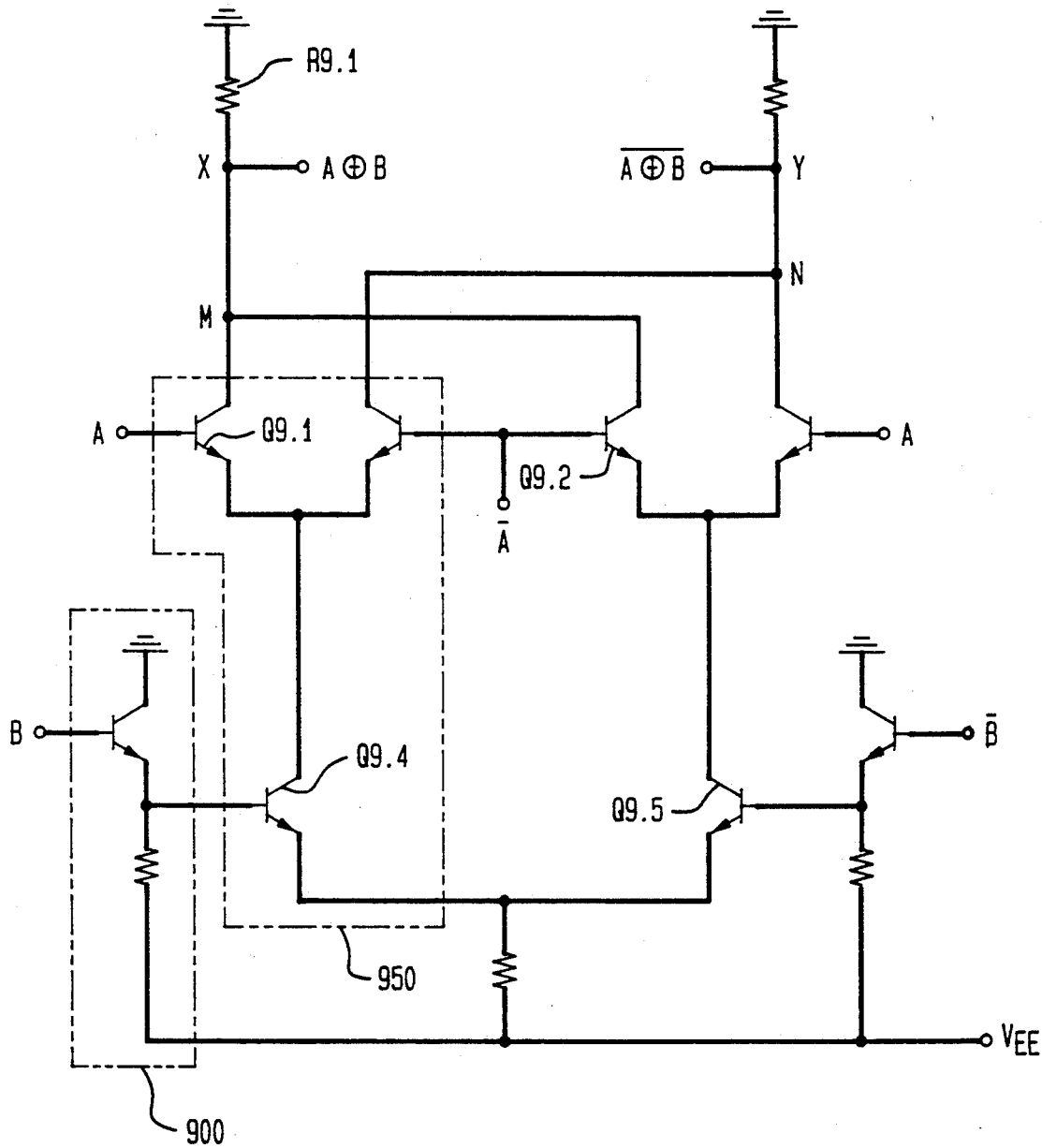
FIG. 9 is a schematic representation of a conventional ECL XOR gate of the prior art. This gate circuit not symmetric with respect to the A and B inputs.

This gate is faster than conventional ECL XOR gates like that of FIG. 9, in which one input signal, but not the other, must propagate through level-shift network 900 as well as stacked transistors. (See, e.g., feature 950 of the figure, showing transistor Q9.4 stacked with the differential pair that includes transistor Q9.1. As shown in the figure, the B signal propagates through stacked pairs, but the A signal does not.) Moreover, unlike such gates of the prior art, the inventive XOR gate exhibits roughly equal delays for both inputs.

Figure 8:
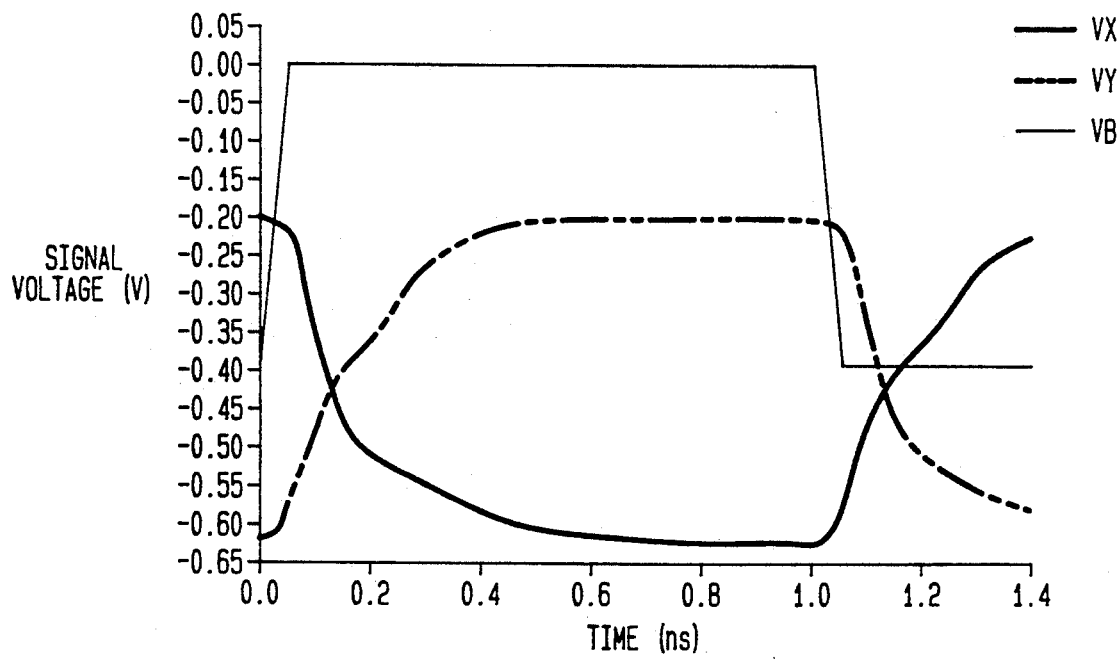
FIG. 8 is a graph representing computer simulations of a B input waveform, and X and Y output waveforms, of the circuit of FIG. 7.

FIG. 8 is a graph representing computer simulations of a B input waveform, and X and Y output waveforms, of the circuit of FIG. 7 operating with a power dissipation of 1.4 mW. A delay of 110 ps is apparent from the figure. By contrast, conventional XOR gates using the same collector resistors and voltage swings have voltage delays of 130 ps.

As noted, the circuit of FIG. 7 has roughly equal delays for the A and B inputs. However, the A and B signal paths are not exactly identical, and as a consequence, a slight phase error may appear at high frequencies. In applications, such as phase-locked loops, where such error is intolerable, it is advantageous to use symmetrical XOR gates (i.e., gates that are fully symmetric with respect to the A and B inputs).

FIG. 9 depicts a conventional ECL XOR gate which is not symmetric with respect to the A and B inputs. The voltage drop across resistor R9.1 appears at node X as the output signal A⊕B. The current in resistor R9.1 follows alternate paths between ground and $V_{EE}$, through transistors Q9.1 and Q9.4, or through transistors Q9.2 and Q9.5. These branches meet at node M, where resistor R9.1 is electrically connected to the collectors of transistors Q9.1 and Q9.2. Current will flow in the Q9.1 branch only when A is high, turning on transistor Q9.1, and B is also high, turning on transistor Q9.4. Current will flow in the Q9.2 branch only when A is low such that the $\bar{A}$ input turns on transistor Q9.2, and B is also low, such that the $\bar{B}$ input turns on transistor Q9.5. The output at X will be a logical 0 whenever current flows in either branch, i.e., when A and B are both high or both low. At other times, the output is a logical 1.

Figure 10:
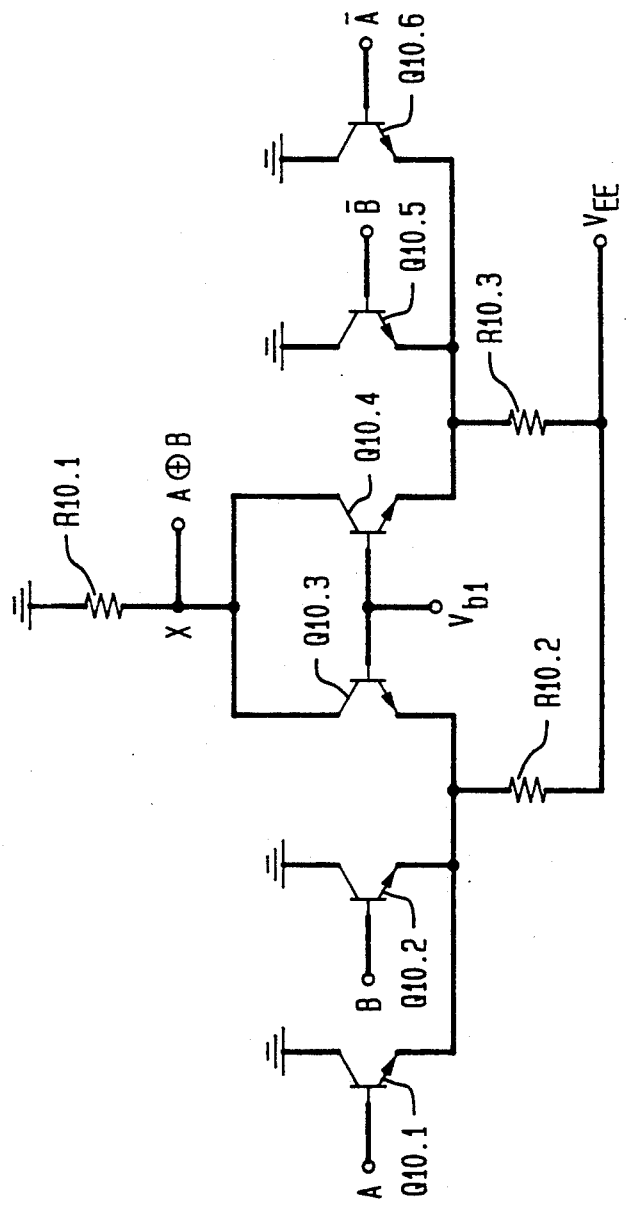
FIG. 10 is a schematic representation of an XOR gate according to the invention in one embodiment. This gate circuit is symmetric with respect to the A and B inputs.

In one embodiment, the invention is an XOR circuit that, unlike the circuit of FIG. 9, is symmetric with respect to the A and B inputs, and in which no current path between the power supply voltage and ground includes a stacked pair of transistors. Such a circuit is depicted in FIG. 10. With reference to FIG. 10, the A⊕B output signal appears at node X as a voltage drop across resistor R10.1. The current in this resistor follows alternate paths between ground and $V_{EE}$, through transistor Q10.3 and resistor R10.2, or through transistor Q10.4 and resistor R10.3. Transistors Q10.1 and Q10.2 control the current flow in the Q10.3 branch, and transistors Q10.5 and Q10.6 control the current flow in the Q10.4 branch. Unlike the conventional circuit of FIG. 9, the control transistors (e.g., transistors Q10.1 and Q10.2) are coupled to the controlled transistor (e.g., transistor Q10.3) by emitter-to-emitter connections. A reference voltage $V_{b1}$ is applied to the bases of transistors Q10.3 and Q10.4. This voltage is set equal to the common-mode level of the input A and B signals and their complements.

Figure 11:
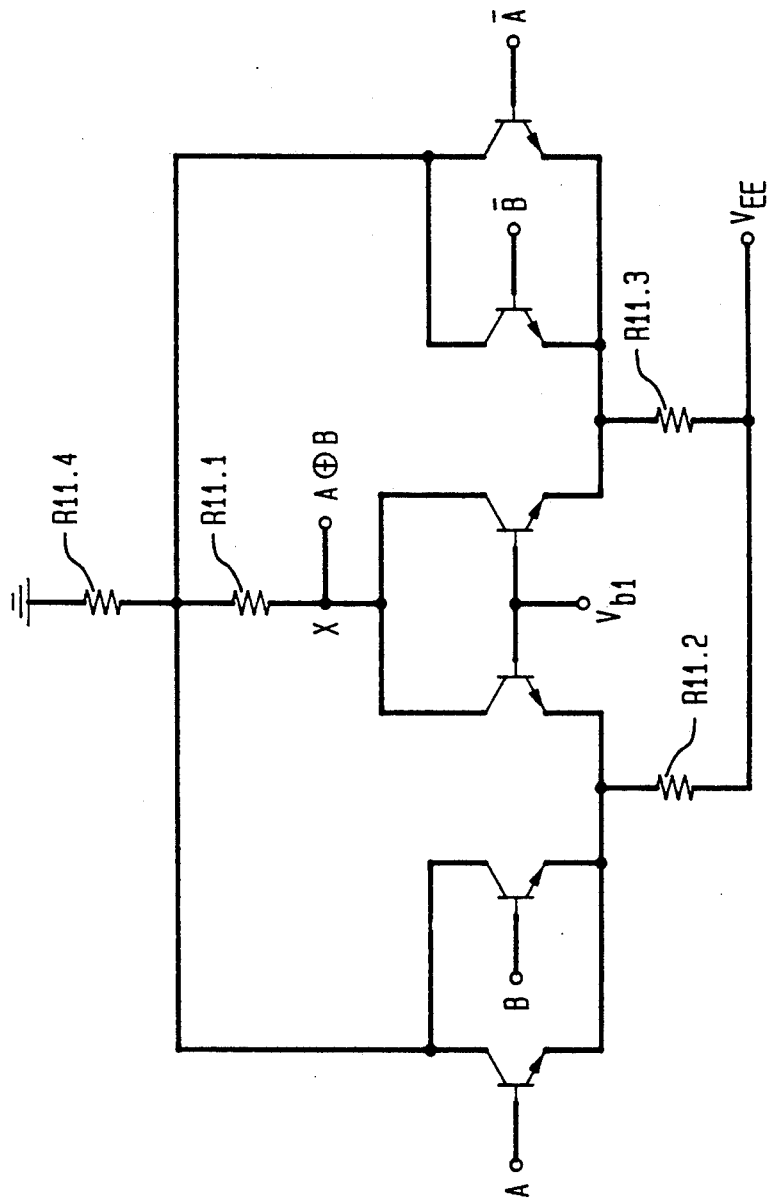
FIG. 11 is a schematic representation of an XOR gate circuit similar to the circuit of FIG. 10, but modified to provide voltage-shifted, type II output.

The operation of the circuit of FIG. 10 is now described. Transistor Q10.3 is on only if both A and B are low, such that transistors Q10.1 and Q10.2 are both off. Similarly, transistor Q10.4 is on only if both A and B are high, such that $\bar{A}$ and $\bar{B}$ are low and transistors Q10.5 and Q10.6 are both off. Thus, the collector current of transistor Q10.3 represents the value of the logical function A AND B, and the collector current of transistor Q10.4 represents the value of the logical function $\bar{A}$ AND $\bar{B}$. The summation of these two currents at node X (equivalent to a logical OR operation) together with the conversion of the total current to a voltage below ground by resistor R 10.1 (equivalent to a logical inversion) results in an output voltage representing the XOR function. This output is a type I signal. If a type II signal is required, the circuit is readily modified as shown in FIG. 11. In FIG. 11, resistor R11.4 carries a current approximately equal to the sum of the currents through resistors R11.2 and R11.3, and in that way establishes the required level shift at the output.

The output of the circuit of FIG. 10 is single-ended. A circuit having differential output is readily provided by adding an exclusive NOR (XNOR) gate G12.1 as shown, e.g., in FIG. 12. The XNOR gate is identical to the XOR gate, except that the A and $\bar{A}$ inputs are interchanged. The compound circuit of FIG. 12 has a single $\bar{A}$ input going both to the base of transistor Q12.6 of the XOR gate, and to the base of transistor Q12.1' of the XNOR gate. The XOR output appears at node X of the XOR gate, and the XNOR output (i.e., the complement of the XOR output) appears at node Y of the XNOR gate.

Figure 12:
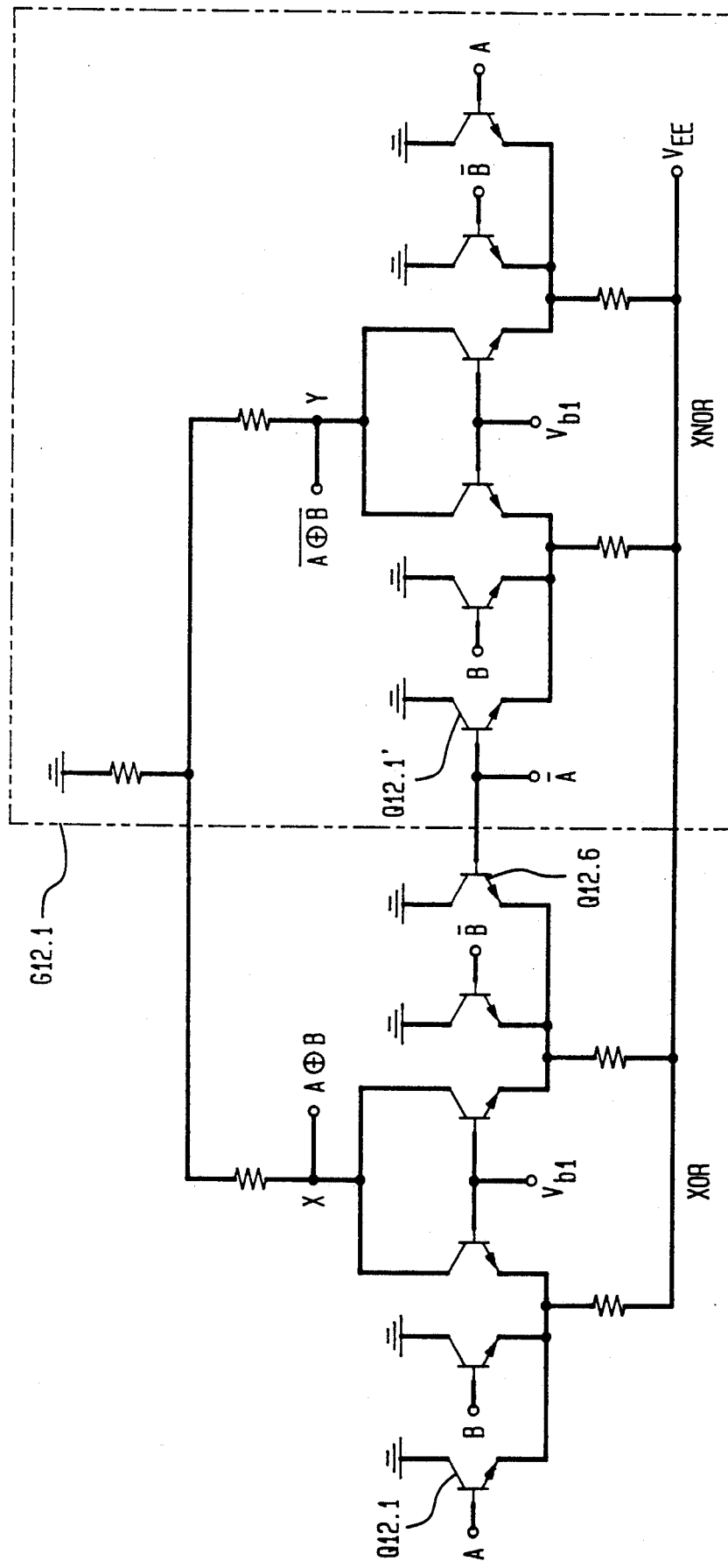
FIG. 12 is a schematic representation of an XOR gate circuit similar to the circuit of FIG. 10, but modified to provide differential output by including an exclusive NOR (XNOR) gate.
Figure 13:
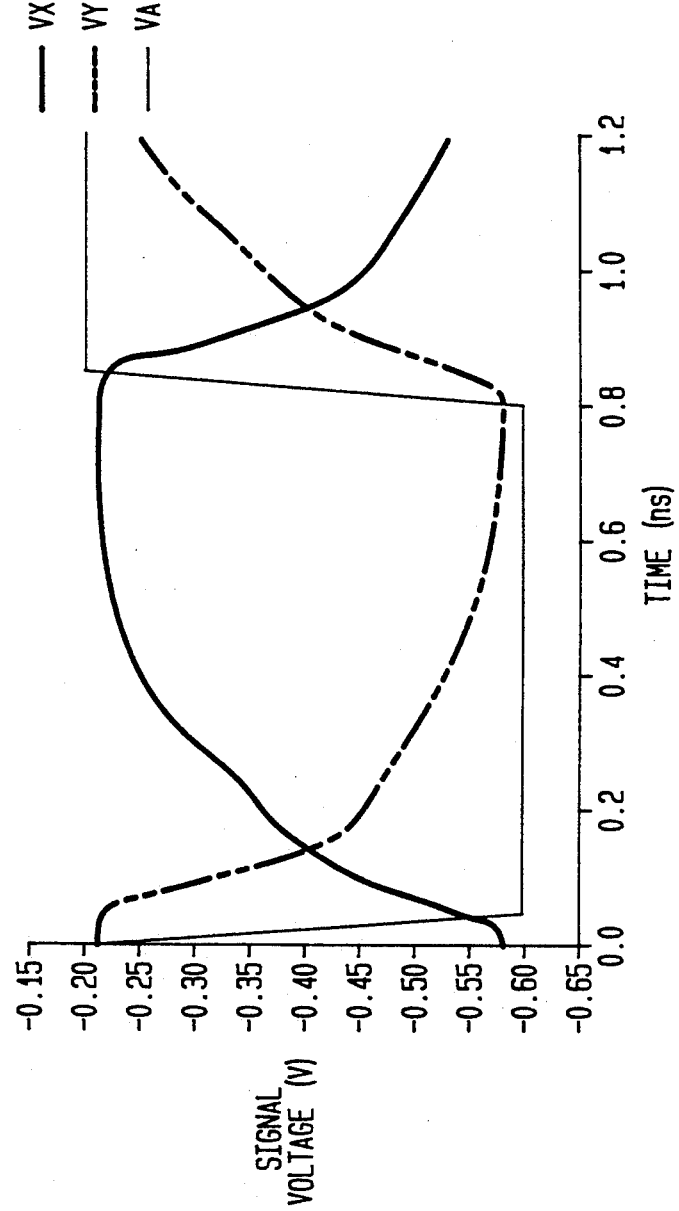
FIG. 13 is a graph representing computer simulations of the A input waveform and the X and Y output waveforms of the symmetric XOR gate of FIG. 12.

FIG. 13 is a graph representing computer simulations of the A input waveform and the X and Y output waveforms of the symmetric XOR gate of FIG. 12, operating with a fanout of 1 and a power dissipation of 1.3 mW in each of the two complementary gates. The figure shows a delay of 120 ps under these conditions.

It often happens in the design of integrated circuits that a signal needs to be distributed across a large chip using a long interconnect having a significant amount of capacitance relative to the substrate. In such cases, it is useful to have a buffer circuit which is able to drive such a capacitive line and to deliver, at the output end, an amplified signal having the appropriate common-mode level. One conventional ECL circuit for performing buffer and level-shift functions is the cascode-configured circuit of FIG. 14. In this circuit, the input signal and its complement are applied, respectively, to the bases of input transistors Q14.1 and Q14.2. The collectors of the input transistors are electrically connected, generally through a capacitive line that is to be driven, to the respective emitters of output transistors Q14.3 and Q14.4. (A parasitic capacitance C14.1 is represented symbolically in the figure.) The output transistors are biased by voltage $V_b$, applied to the bases of these transistors. The collectors of the output transistors are connected to ground through resistors R14.1 and R14.2, and the difference between the voltage drops through these resistors is taken at nodes X and Y as the output signal. The emitters of the input transistors are connected to $V_{EE}$ through resistor R14.3. Collector current will flow in each output transistor only when the corresponding input transistor has been turned on by a high value at its input. (The figure also indicates optional resistor R14.4, which may be included to improve the operating speed of the circuit.)

The invention, in one embodiment, is a circuit for performing a buffer and level-shift function. In this inventive circuit, no current path between ground and $V_{EE}$ includes a stacked pair of transistors, and the input transistors control current flow in the output transistors by means of emitter-to-emitter connections. Such a circuit is depicted in FIG. 15. (A parasitic capacitance C15.1 is indicated symbolically in the figure.) As in the circuit of FIG. 14, complementary input signals A and $\overline{A}$ are applied to the bases of respective input transistors Q15.1 and Q15.2. Each input transistor controls the flow of collector current in a corresponding one of output transistors Q15.3 and Q15.4, respectively. A bias voltage is applied to the bases of the output transistors. The emitters of transistors Q15.1 and Q15.2 are connected to $V_{EE}$ through resistors R15.1 and R15.2, respectively. The collector current in transistor Q15.3 flows through resistors R15.6 and R15.8, producing a voltage drop at node Y. The collector current in transistor Q15.4 flows through resistors R15.7 and R15.8, producing a voltage drop at node X. The difference between these voltage drops is taken as the output signal.

Figure 14:
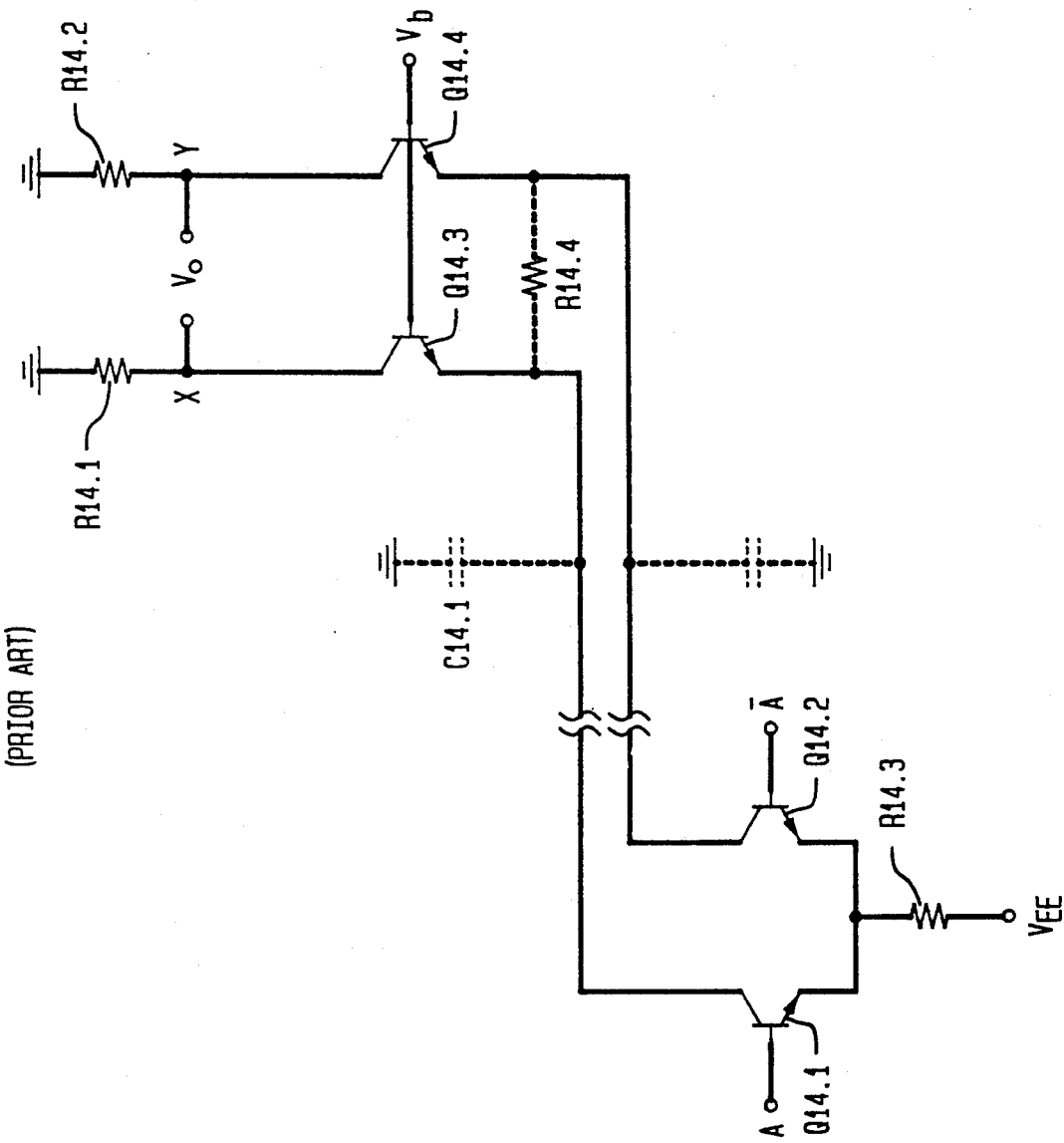
FIG. 14 is a schematic representation of a conventional ECL circuit of the prior art for performing buffer and level-shift functions.
Figure 15:
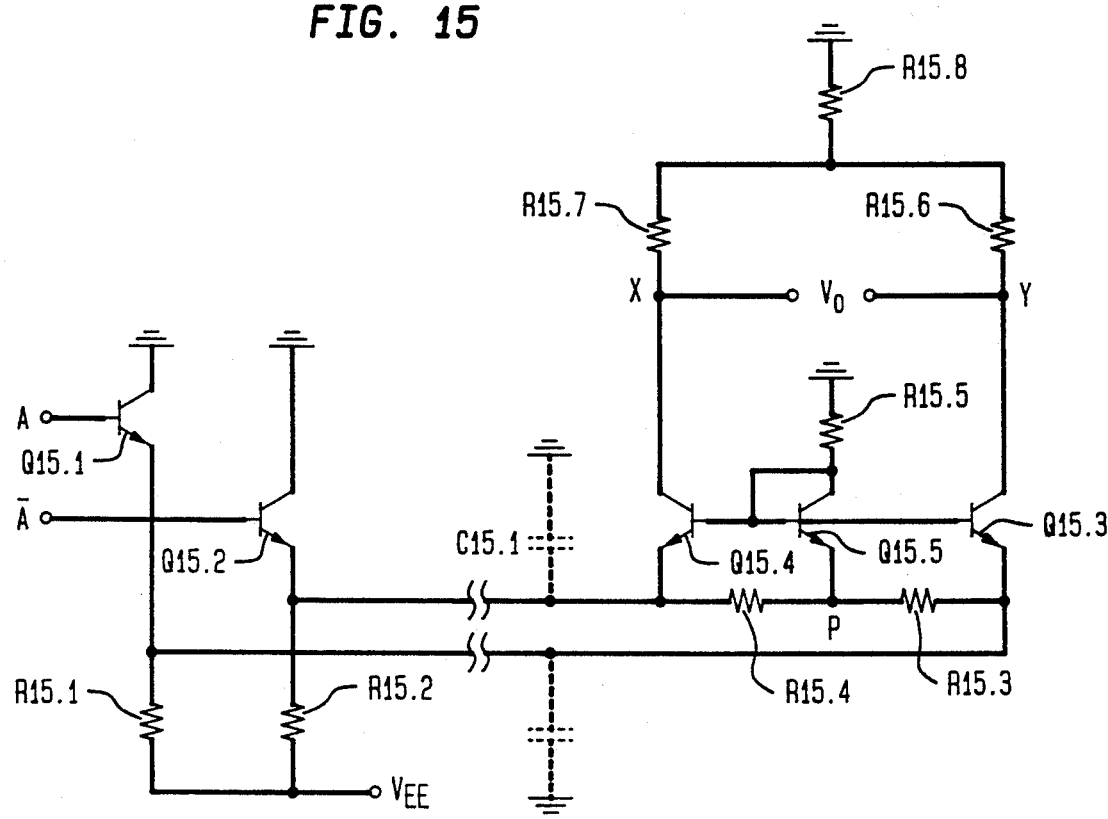
FIG. 15 is a schematic representation of a circuit for performing buffer and level-shift functions in accordance with the invention in one embodiment.

However, the circuit of FIG. 15 differs from the circuit of FIG. 14 in several important respects. As noted, the input transistors control the output transistors by means of emitter-to-emitter connections rather than by means of a series connection. In order to reduce sensitivity to unwanted voltage drops that might occur, e.g., in long interconnects, the common-mode level of the signals received from the interconnects is recovered at the output end, and the output transistors are biased according to that level. For this purpose, resistors R15.3 and R15.4, typically of equal value, are configured as a voltage divider between the emitters of transistors Q15.3 and Q15.4. The common-mode level is established at node P (effectively, the center tap of the voltage divider), and shifted up by transistor Q15.5, which has an emitter connection to node P, a collector connection to ground through resistor R15.5, and base connections to the bases of the output transistors. As a consequence of the recovery and shift of the common-mode level, the base voltage of transistor Q15.5 is close to the common-mode level of the input signals A and $\overline{A}$ and thus provides the proper bias for the output transistors. The collector currents of the input and output transistors are readily set to desired levels by sizing them with respect to transistor Q15.5 and by selecting appropriate values of resistors R15.1-R15.5.

Figure 16:
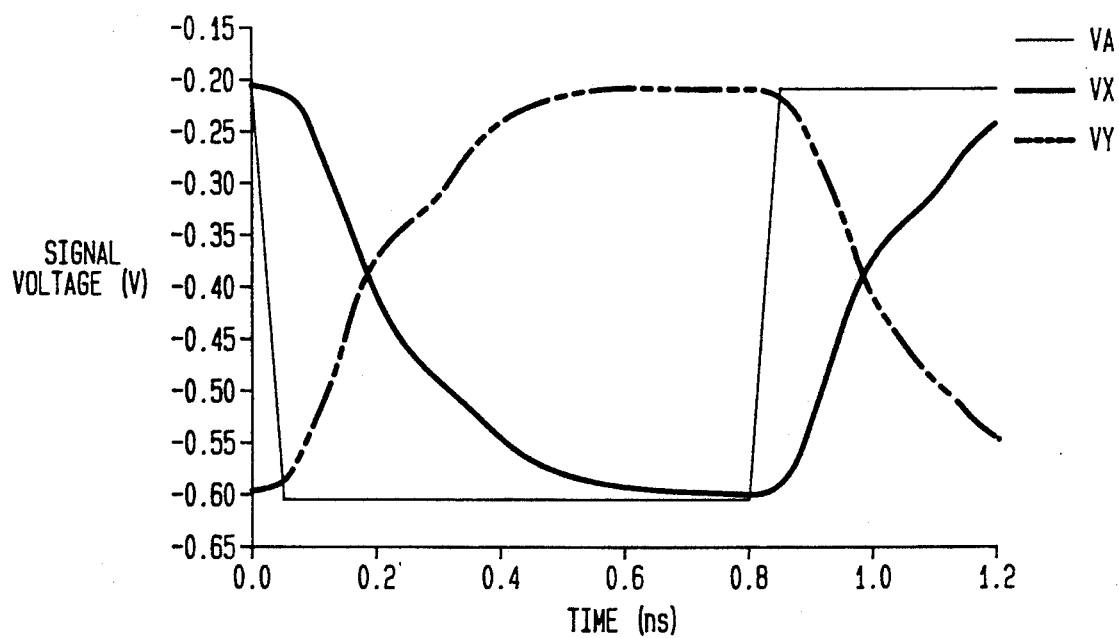
FIG. 16 is a graph representing computer simulations of the A input waveform and the X and Y output waveforms of the circuit of FIG. 15.

FIG. 16 is a graph representing computer simulations of the A input waveform and the X and Y output waveforms of the circuit of FIG. 15, operating with a fanout of 1, a power dissipation of 1.4 mW, and an interconnect capacitance 0.5 pF. It is evident from the figure that the circuit operates with a delay of 150 ps.

I claim:

1. A digital circuit for producing an output voltage responsive to A, B, and C input signals and their respective complements $\overline{A}$, $\overline{B}$, and $\overline{C}$, the circuit comprising:
   a) first and second bipolar transistors, each having a base, an emitter, and a collector, the transistors constituting a first differential pair and having emitter terminals electrically connected to a first common node;
   b) means for inputting the A signal to the first transistor base and means for inputting the $\overline{A}$ signal to the second transistor base;
   c) third and fourth bipolar transistors, each having a base, an emitter, and a collector, the transistors constituting a second differential pair and having emitter terminals electrically connected to a second common node;
   d) means for inputting the B signal to the third transistor base and means for inputting the $\overline{B}$ signal to the fourth transistor base;
   e) resistive means for electrically connecting a terminal which is maintained at a power supply voltage to the first and second nodes during at least a portion of the time that the circuit is operating;
   f) resistive means for electrically connecting the collectors of the first, second, third, and fourth transistors to a terminal or group of terminals maintained at ground potential;
   g) means, responsive to the C signal, for alternating the voltage at the first node between two distinct voltage levels such that when the node voltage is at one of the levels, the first and second transistors are disabled, and when the node voltage is at the other level, the first and second transistors are enabled;
   h) means, responsive to the $\overline{C}$ signal, for alternating the voltage at the second node between two distinct voltage levels such that when the node voltage is at one of the levels, the third and fourth transistors are disabled, and when the node voltage is at the other level, the third and fourth transistors are enabled; and
   i) first and second output voltage terminals, the first output terminal electrically connected to the collectors of the first and third transistors, and the second output terminal electrically connected to the collectors of the second and fourth transistors, CHARACTERIZED IN THAT
   j) the alternating means comprise fifth and sixth bipolar transistors, each having a base and an emitter, and further having a collector electrically connected to a terminal maintained at ground potential;
   k) the emitter of the fifth transistor is electrically connected to the first node, and the emitter of the sixth transistor is electrically connected to the second node;
   l) the alternating means further comprise means for electrically inputting the C signal to the base of the fifth transistor and for inputting the $\overline{C}$ signal to the base of the sixth transistor such that the voltages at the first and second nodes change in a complementary fashion in response to changes in the C signal; and
   m) no path for electric current between the power supply voltage terminal and a terminal at ground potential via any one of the first, second, third, and fourth transistors includes a stacked pair of transistors.

2. The circuit of claim 1, wherein the C signal is a clock signal and the output voltage corresponds, in alternation, to the A signal or the B signal according to alternations of the clock signal, resulting in a multiplexed output.

3. The circuit of claim 1, wherein the B signal is the logical equivalent of the $\overline{A}$ signal, such that the output voltage corresponds to the exclusive OR function $A \oplus C$.

4. A digital latch circuit for producing an output voltage which corresponds to the voltage state of an input signal at a time selected by changing the voltage state of a clock signal, the circuit comprising:
   a) first and second bipolar transistors, each having a base, an emitter, and a collector, the transistors constituting a differential pair and having emitter terminals electrically connected to a first common node;
   b) means for inputting the input signal to the first transistor base and means for inputting the input signal complement to the second transistor base;
   c) third and fourth bipolar transistors, each having a base, an emitter, and a collector, the transistors constituting a latch pair wherein the base of each is electrically connected to the collector of the other, said third and fourth transistors having emitter terminals electrically connected to a second common node;
   d) resistive means for electrically connecting a terminal which is maintained at a power supply voltage to the first and second nodes during at least a portion of the time that the circuit is operating;
   e) resistive means for electrically connecting the collectors of the first, second, third, and fourth transistors to a terminal or group of terminals maintained at ground potential;
   f) means, responsive to the clock signal, for alternating the voltage at the first node between two distinct voltage levels such that when the node voltage is at one of the levels, the first and second transistors are disabled, and when the node voltage is at the other level, the first and second transistors are enabled;
   g) means, responsive to the clock signal complement, for alternating the voltage at the second node between two distinct voltage levels such that when the node voltage is at one of the levels, the third and fourth transistors are disabled, and when the node voltage is at the other level, the third and fourth transistors are enabled; and
   h) first and second output voltage terminals, the first output terminal electrically connected to the collectors of the first and third transistors, and the second output terminal electrically connected to the collectors of the second and fourth transistors, CHARACTERIZED IN THAT
   i) the alternating means comprise fifth and sixth bipolar transistors, each having a base and an emitter, and further having a collector electrically connected to a terminal maintained at ground potential;
   j) the emitter of the fifth transistor is electrically connected to the first node, and the emitter of the sixth transistor is electrically connected to the second node;
   k) the alternating means further comprise means for electrically inputting the clock signal to the base of the fifth transistor and for inputting the clock signal complement to the base of the sixth transistor such that the voltages at the first and second nodes change in a complementary fashion in response to changes in the clock signal; and
   l) no path for electric current between the power supply voltage terminal and a terminal at ground potential via any one of the first, second, third, and fourth transistors includes a stacked pair of transistors.

5. A digital circuit, responsive to an A input signal, a B input signal, and the complementary A and B signals, for producing, at a first node, an output voltage representing the exclusive OR function $A \oplus B$, the circuit comprising:
   a) at least one terminal maintained at ground potential and at least one terminal maintained at a power supply voltage;
   b) first and second bipolar transistors, to be referred to as the first and second gate transistors, said gate transistors providing alternate paths for electric current flowing between the power supply and ground terminals, each of said gate transistors having an emitter, a base, and a collector, the collector of said gate transistors electrically connected at the first node;
   c) resistive means electrically connected to the ground terminal and to the first node such that electric current flowing through either one of the alternate paths produces a voltage drop across said resistive means, said voltage drop being measurable as the output voltage;
   d) first means, responsive to the A and B signals, for controlling the flow of electric current through the first gate transistor such that a substantial flow of current is permitted only when the A and B signals both have high voltage states; and
   e) second means, responsive to the complementary A and B signals, for controlling the flow of electric current through the second gate transistor such that a substantial flow of current is permitted only when the complementary A and B signals both have high voltage states, CHARACTERIZED IN THAT
   f) the first controlling means comprise first and second bipolar transistors, to be referred to as the first and second control transistors, each of said control transistors having a collector electrically connected to a ground terminal and an emitter electrically connected to the emitter of the first gate transistor, and further having a base;
   g) the second controlling means comprise third and fourth bipolar transistors, to be referred to as the third and fourth control transistor, each of said control transistors having a collector electrically connected to a ground terminal and an emitter electrically connected to the emitter of the second gate transistor, and further having a base;
   h) the circuit further comprises means for inputting the A signal to the base of the first control transistor, the B signal to the base of the second control transistor, the complementary B signal to the base of the third control transistor, and the complementary A signal to the base of the fourth control transistor;

i) a common-mode voltage level is associated with the A and B signals, and the circuit further comprises means for applying a bias voltage to the bases of the first and second gate transistors, the bias voltage approximately equal to the common-mode voltage; and j) neither of the alternate paths includes a stacked pair of transistors.

6. The circuit of claim 5, further comprising a level-shifting resistor, wherein:
   a) the first resistive means and the collectors of the first, second, third and fourth bipolar transistors are electrically connected to a ground terminal through the level-shifting resistor; and
   b) the resistance of the level-shifting resistor is selected such that the common-mode level of the output voltage is shifted by a predetermined amount relative to the output-voltage common-mode level of an otherwise equivalent circuit having a level-shifting resistance of zero.

7. The circuit of claim 5, further comprising an XNOR circuit responsive to the A and B input signals and the complementary A and B input signals, the XNOR circuit adapted to produce, at a second node, an XNOR output voltage that represents the logical complement of the output voltage at the first node, such that the voltage difference between the first and second nodes constitutes a differential output signal, wherein the XNOR circuit comprises:
   a) third and fourth bipolar, gate transistors for providing alternate paths for electric current flowing between the power supply and ground terminals, each of said gate transistors having a collector, the collectors of said gate transistors electrically connected at the second node;
   b) resistive means electrically connected to the ground terminal and to the second node such that electric current flowing through either one of the alternate paths produces a voltage drop across said resistive means, said voltage drop being measurable as the XNOR output voltage;
   c) fifth and sixth bipolar, control transistors for controlling the flow of electric current through the third gate transistor such that a substantial flow of current is permitted only when the A signal has a low voltage state and the B signal has a high voltage state; and
   d) seventh and eigth bipolar, control transistors for controlling the flow of electric current through the fourth gate transistor such that a substantial flow of current is permitted only when the A signal has a high voltage state and the B signal has a low voltage state.

8. A digital circuit for providing an output voltage which corresponds to an input signal, the circuit comprising:

a) at least one terminal maintained at ground potential, and at least one terminal maintained at a power supply voltage level;

b) two bipolar transistors, to be referred to as the first and second input transistors, each having a base, an emitter, and a collector; means for applying the input signal to the base of the first input transistor; and means for applying the input signal complement to the base of the second input transistor;

c) two bipolar transistors, to be referred to as the first and second output transistors, each having a base, an emitter, and a collector;

d) first resistive means for electrically coupling the collectors of the first and second output transistors to a ground terminal or terminals such that electric current flowing into the collector of each output transistor will establish a voltage drop, one or both of said voltage drops defining the output voltage;

e) means for applying a bias voltage to the bases of the output transistors;

f) second resistive means for electrically connecting the emitters of the input transistors to a terminal or terminals at the power supply voltage; and g) means for electrically connecting the first and second input transistors to the first and second output transistors, respectively, such that the electric current flowing into the collector of each output transistor can be modulated by the input signal or input signal complement applied to the base of the corresponding input transistor, CHARACTERIZED IN THAT h) the emitter of each input transistor is electrically connected to the emitter of the corresponding output transistor;

i) the biasing means comprise a voltage divider having a first end electrically connected to the emitter of the first output transistor, a second end electrically connected to the emitter of the second output transistor, and a tap intermediate the first and second ends;

j) the biasing means further comprise a bipolar transistor, to be referred to as the bias transistor, said bias transistor having an emitter, a base, and a collector, said collector being electrically connected to said base such that said bias transistor is self-biased;

k) the emitter of the bias transistor is electrically connected to the tap, the base of the bias transistor is electrically connected to the bases of the first and second output transistors, and the collector of the bias transistor is electrically connected through third resistive means to a ground terminal; and l) no path for electric current between a power supply voltage terminal and a ground terminal via any one of the input or output transistors includes a stacked pair of transistors.

* * * * *